United States Patent
Seo et al.

(10) Patent No.: US 12,433,089 B2
(45) Date of Patent: Sep. 30, 2025

(54) LIGHT EMITTING DEVICE, METHOD FOR MANUFACTURING THE SAME, AND ELECTRONIC DEVICE INCLUDING THE SAME

(71) Applicant: SAMSUNG ELECTRONICS CO., LTD., Suwon-si (KR)

(72) Inventors: Hongkyu Seo, Gwacheon-si (KR); Tae Hyung Kim, Seoul (KR); Eun Joo Jang, Suwon-si (KR); Won Sik Yoon, Seoul (KR); Hyo Sook Jang, Suwon-si (KR); Oul Cho, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 116 days.

(21) Appl. No.: 17/515,784

(22) Filed: Nov. 1, 2021

(65) Prior Publication Data

US 2022/0149311 A1  May 12, 2022

(30) Foreign Application Priority Data

Nov. 9, 2020  (KR) .......... 10-2020-0148597

(51) Int. Cl.
 *H10K 71/00* (2023.01)
 *H10K 50/115* (2023.01)
 (Continued)

(52) U.S. Cl.
 CPC .......... *H10K 50/115* (2023.02); *H10K 50/16* (2023.02); *H10K 85/60* (2023.02); *H10K 71/40* (2023.02);
 (Continued)

(58) Field of Classification Search
 CPC ...... H10K 50/16; H10K 71/00; H10K 50/115; H10K 85/60; H10K 2102/00; H10K 2102/331
 See application file for complete search history.

(56) References Cited

U.S. PATENT DOCUMENTS 11,870,004 B2    1/2024  Yang et al.
2013/0280854 A1* 10/2013  Jasieniak .......... H01L 21/02469
                                                      438/93
(Continued)

FOREIGN PATENT DOCUMENTS

KR    20200020435 A  *  2/2020  ............. H01L 31/32
KR    20200118728 A     10/2020

OTHER PUBLICATIONS

Reed T. Heintzkill, Fabrication of Silver-Doped Zinc Oxide Thin Films Through Optimized Sol-Gel Deposition and Nanoparticle Wetting Process, A Thesis Submitted in Partial Fulfillment of the Requirements for the Degree of Master of Science in Engineering, Dec. 2018, 212 pp.

(Continued)

*Primary Examiner* — Joshua Benitez Rosario
*Assistant Examiner* — Christopher A Culbert
(74) *Attorney, Agent, or Firm* — CANTOR COLBURN LLP

(57) ABSTRACT

A method of manufacturing a light emitting device that includes providing a first electrode, forming a light emitting layer including quantum dots on the first electrode, forming an electron auxiliary layer on the light emitting layer, and forming a second electrode on the electronic auxiliary layer. The forming of the electron auxiliary layer includes forming an electron auxiliary layer including a plurality of metal (Continued)

oxide nanoparticles, and contacting the plurality of metal oxide nanoparticles with a base including a hydroxyl group (OH).

7 Claims, 8 Drawing Sheets

(51) Int. Cl.
    *H10K 50/16*     (2023.01)
    *H10K 85/60*     (2023.01)
    *H10K 71/40*     (2023.01)
    *H10K 102/00*     (2023.01)

(52) U.S. Cl.
    CPC ... *H10K 2102/00* (2023.02); *H10K 2102/331* (2023.02)

(56) References Cited

U.S. PATENT DOCUMENTS

| | | | |
|---|---|---|---|
| 2019/0280235 A1 | 9/2019 | Kim et al. | |
| 2020/0321490 A1* | 10/2020 | Yang | ........... H01L 33/0062 |

OTHER PUBLICATIONS

English Translation of Office Action dated Jul. 1, 2025 of the corresponding Korean Patent Application No. 10-2020-0148597, 8 pp.

Office Action dated Jul. 1, 2025 of the corresponding Korean Patent Application No. 10-2020-0148597, 6 pp.

\* cited by examiner

LIGHT EMITTING DEVICE, METHOD FOR MANUFACTURING THE SAME, AND ELECTRONIC DEVICE INCLUDING THE SAME

CROSS-REFERENCE TO RELATED APPLICATION

This application claims priority to Korean Patent Application No. 10-2020-0148597 filed in the Korean Intellectual Property Office on Nov. 9, 2020, and all benefits accruing therefrom under 35 U.S.C. 119, the content of which is herein incorporated by reference in its entirety.

BACKGROUND

1. Field

A light emitting device, a method for manufacturing the light emitting device, and a display device including the light emitting device are disclosed.

2. Description of the Related Art

Quantum dots are a nanocrystal semiconductor material having a diameter of less than or equal to around 10 nanometers, and which exhibit quantum confinement effects. Quantum dots emit light within a relatively narrow wavelength region in comparison to many other known phosphors. Quantum dots emit light when excited electrons transition from a conduction band to a valance band, and the wavelength of emitted light varies in-part on particle size of the quantum dot. As the particle size of the quantum dot deceases the quantum dot emits light of a shorter wavelength. Accordingly, light may be emitted in a desirable wavelength region by adjusting the size of the quantum dot. Moreover, a light emitting layer including quantum dots and the various types of light emitting devices including the quantum dots may provide a reduction in production costs compared to production costs associated with organic light emitting diodes.

The luminous efficiency of a light emitting layer that includes quantum dots is determined by a quantum efficiency of quantum dots, a balance of charge carrier, light extraction efficiency, leakage current, and the like. Accordingly, in order to improve the luminous efficiency of the light emitting layer, one may seek to confine excitons to the light emitting layer, enhance the efficiency or mobility of holes and electrons to from excitons and come in contact with quantum dots in the light emitting layers, and/or preventing leakage current, etc.

SUMMARY

An embodiment provides a light emitting device capable of addressing the problem of an increase in leakage current due to defects in metal oxide nanoparticles that are present in the electron transport layer. In addition, device efficiency may be reduced and/or electron mobility may be lowered (or luminance may be reduced) by residual organic materials at the interface between the light emitting layer including quantum dots and the electron transport layer. The interfacial defects may also result in a decrease in life-span due to a charging phenomenon. An embodiment provides a light emitting device that is capable of addressing one or more of these technical issues of an electron auxiliary layer that include metal oxide nanoparticles.

Another embodiment provides a method of manufacturing the light emitting device.

Another embodiment provides a display device including the light emitting device.

According to an embodiment, a method of manufacturing a light emitting device includes providing a first electrode, forming a light emitting layer including quantum dots on the first electrode, forming an electron auxiliary layer on the light emitting layer, wherein the forming of the electron auxiliary layer includes applying a plurality of metal oxide nanoparticles, and contacting the plurality of metal oxide nanoparticles with a base including a hydroxyl group (OH), and forming a second electrode on the electronic auxiliary layer.

The base including the hydroxyl group may include an alkaline metal hydroxide, an alkylammonium hydroxide, or a combination thereof.

The alkaline metal hydroxide may include LiOH, NaOH, KOH, RbOH, CsOH, or a combination thereof.

The alkylammonium hydroxide may include tetramethylammonium hydroxide (TMAH), tetraethylammonium hydroxide (TEAH), tetra propylammonium hydroxide (TPAH), tetrabutylammonium hydroxide (TBAH), or a combination thereof.

The contacting of the plurality of metal oxide nanoparticles with the base including a hydroxyl group may include preparing a solution by dissolving the base in a solvent, and applying the solution to the electron auxiliary layer by coating the electron auxiliary layer with the solution, or by immersing the electron auxiliary layer in the solution.

The solvent may include water, acetone, alcohol, ether, ethyl acetate, dimethylsulfoxide (DMSO), or a combination thereof.

A concentration of the base including the hydroxyl group in the solution may be less than or equal to about 0.1 moles per liter (M).

The base including the hydroxyl group may have a molecular weight of less than or equal to about 200 grams per mole (g/mol) and $pK_b$ of less than or equal to about 10.

The forming of the electron auxiliary layer may further include drying the electron auxiliary layer at about 0° C. to about 50° C. after contacting the plurality of metal oxide nanoparticles with the base.

According to another embodiment, a light emitting device includes a first electrode and a second electrode each having a surface that faces the other, a light emitting layer disposed between the first electrode and the second electrode, the light emitting layer including quantum dots, and an electron auxiliary layer disposed between the light emitting layer and the second electrode, the electron auxiliary layer including metal oxide nanoparticles, wherein in the electron auxiliary layer, a value $R_{C-O/C=O}$ of Formula 1 is greater than about 0.91.

$$R_{C-O/C=O} = I_{C-O}/I_{C=O} \quad \text{Formula 1}$$

In Formula 1, $I_{C-O}$ is a C—O group peak intensity, and $I_{C=O}$ is a C=O group peak intensity, in a Fourier transform infrared spectroscopy spectrum of the electron auxiliary layer.

The metal oxide nanoparticles of the electron auxiliary layer may be surface-treated with a base including a hydroxyl group (OH).

The electron auxiliary layer may have a value $R_{N-CH3/C=O}$ of Formula 2 of greater than or equal to about 0.45.

$$R_{N-CH3/C=O} = I_{N-CH3}/I_{C=O} \quad \text{Formula 2}$$

In Formula 2, $I_{N-CH_3}$ is an N—$CH_3$ group peak intensity, and $I_{C=O}$ is a C=O group peak intensity, in a Fourier transform infrared spectroscopy spectrum.

The electron auxiliary layer may have a value $R_{N-CH_3/C-O}$ of Formula 3 of greater than or equal to about 0.50.

$$R_{N-CH_3/C-O} = I_{N-CH_3}/I_{C-O} \quad \text{Formula 3}$$

In Formula 3, $I_{N-CH_3}$ is an N—$CH_3$ group peak intensity, and $I_{C-O}$ is a C—O group peak intensity, in a Fourier transform infrared spectroscopy spectrum.

The electron auxiliary layer may have a mole ratio of carbon atoms to total metal atoms of the metal oxide nanoparticles of less than or equal to about 1.3:1.

The electron auxiliary layer may include metal oxide nanoparticles satisfying Formula 4.

$$D < (Radius1 + Radius2) \quad \text{Formula 4}$$

In Formula 4, D is a center-to-center distance between a first metal oxide nanoparticle and an adjacent second metal oxide nanoparticle, and Radius1 and Radius2 are radii of the first metal oxide nanoparticle and the second metal oxide nanoparticle, respectively.

The electronic auxiliary layer may have electrical conductivity of greater than about $6.5 \times 10^{-8}$ siemens per centimeter (S/cm).

The metal oxide may be an oxide of a metal including Zn, Mg, Ca, Zr, W, Li, Ti, Y, Al, or a combination thereof.

The metal oxide may be represented by Chemical Formula 1.

$$Zn_{1-x}M_xO \quad \text{Chemical Formula 1}$$

In Chemical Formula 1, M is Mg, Ca, Zr, W, Li, Ti, Y, Al, or a combination thereof, and $0 \leq x \leq 0.5$.

The metal oxide nanoparticles may have an average particle size of about 1 nanometer (nm) to about 100 nm.

The electron auxiliary layer may further include an organic ligand attached to a surface of the metal oxide nanoparticles.

The organic ligand may include a carboxylate moiety.

The organic ligand may include an acetate moiety, a propionate moiety, an acrylate moiety, or a combination thereof.

The light emitting device may further include a hole auxiliary layer including a hole injecting layer (HIL), a hole transporting layer (HTL), an electron blocking layer (EBL), or a combination thereof, disposed between the first electrode and the light emitting layer.

According to another embodiment, an electronic device including the light emitting device is provided.

The electronic device may be a display device, a sensor, a photodetector, a photoelectric conversion device, a laser, or a linear optical device.

DETAILED DESCRIPTION

Figure 1:
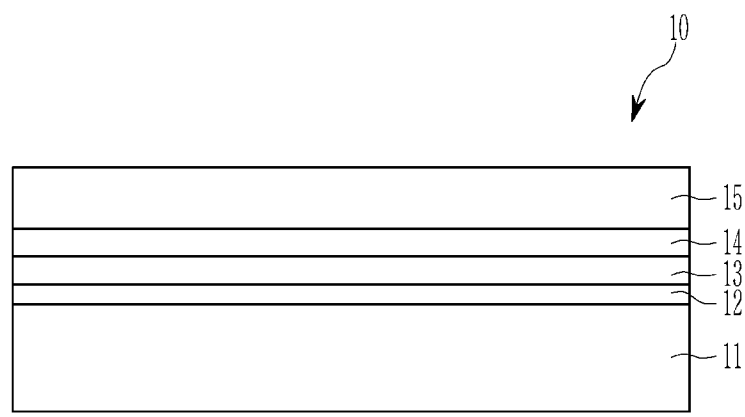
FIG. 1 is a schematic cross-sectional representation of a light emitting device according to an embodiment.

Advantages and characteristics of this disclosure, and a method for achieving the same, will become evident referring to the following exemplary embodiments together with the attached drawings attached. However, the embodiments should not be construed as being limited to the embodiments set forth. Like reference numerals refer to like elements throughout.

If not defined otherwise, all terms (including technical and scientific terms) in the specification may have the same meaning as commonly understood by one skilled in the art to which the art belongs. It will be further understood that terms defined in a generally used dictionary should be interpreted as having a meaning that is consistent with their meaning in the context of the relevant art and the present disclosure and will not be interpreted in an idealized or overly formal sense unless expressly so defined.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprise" and variations such as "comprises", "comprising", "includes", or "including" will be understood to imply the inclusion of stated features, regions, integers, steps, operations, elements, and/or components, and do not preclude the presence or addition of one or more other features, regions, integers, steps, operations, elements, components, and/or groups thereof.

In the present specification, it will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, the term "substituted" refers to a compound or a moiety wherein at least one of hydrogen atoms thereof is replaced by a substituent selected from a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxyl group (—OH), a nitro group (—$NO_2$), a cyano group (—CN), an amino group (—NRR', wherein R and R' are independently hydrogen or a C1 to C6 alkyl group), an azido group (—$N_3$), an amidino group (—C(=NH)$NH_2$), a hydrazino group (—$NHNH_2$), a hydrazono group (=N($NH_2$)), an aldehyde group (—C(=O)H), a carbamoyl group (—C(O)$NH_2$), a thiol group (—SH), an ester group (—C(=O)OR, wherein R is a C1 to C6 alkyl group or a C6 to C12 aryl group), a carboxyl group (—OOOH) or a salt thereof (—C(=O)OM, wherein M is an organic or inorganic cation), a sulfonic acid group (—$SO_3$H) or a salt thereof (—$SO_3$M, wherein M is an organic or inorganic cation), a phosphoric acid group (—$PO_3H_2$) or a salt thereof (—$PO_3$MH or —$PO_3M_2$, wherein M is an organic or inorganic cation), and a combination thereof.

As used herein, "hetero" refers to one including 1 to 3 heteroatoms of N, O, S, Si, P, or a combination thereof.

As used herein, "Group" refers to a group of Periodic Table.

As used herein, "Group I" may include Group IA and Group IB, and examples of Group I include Li, Na, K, Rb, or Cs, but is not limited thereto.

As used herein, "Group II" refers to Group IIA and Group IIB, and examples of Group metal may be Cd, Zn, Hg, and Mg, but are not limited thereto.

As used herein, "Group III" refers to Group IIIA and Group IIIB, and examples of Group III metal may be Al, In, Ga, and Tl, but are not limited thereto.

As used herein, "Group IV" refers to Group IVA and Group IVB, and examples of a Group IV metal may be Si, Ge, and Sn, but are not limited thereto. As used herein, "metal" may include a semi-metal such as Si.

As used herein, "Group V" refers to Group VA, and examples may include nitrogen, phosphorus, arsenic, antimony, and bismuth, but are not limited thereto.

As used herein, "Group VI" refers to Group VIA, and examples may include sulfur, selenium, and tellurium, but are not limited thereto.

A light emitting device according to an embodiment will be described with reference to the drawings.

FIG. 1 is a schematic cross-sectional representation of a light emitting device according to an embodiment.

Referring to FIG. 1, the light emitting device 10 includes a first electrode 11 and a second electrode 15 each having a surface that faces the other and a light emitting layer 13 disposed between the first electrode 11 and the second electrode 15, the light emitting layer including quantum dots, and an electron auxiliary layer 14 disposed between the second electrode 15 and the light emitting layer 13. In addition, the light emitting device 10 may optionally include a hole auxiliary layer 12 (as shown) between the first electrode 11 and the light emitting layer 13.

The substrate (not shown) may be disposed at an opposite surface of first electrode 11 or an opposite surface of the second electrode 15. For example, the substrate may be disposed at the first electrode 11. The substrate may be a substrate including an insulating material (e.g., an insulating transparent substrate). The substrate may include glass, various polymers such as a polyester (e.g., polyethylene terephthalate (PET), polyethylene naphthalate (PEN)), polycarbonate, polyacrylate, polyimide, polyamideimide, etc.; polysiloxane (e.g., PDMS); an inorganic material such as $Al_2O_3$, ZnO, etc.; or a combination thereof, but is not limited thereto. The substrate may be made of a silicon wafer or the like. Herein, the term "transparent" refers to a stated element having a light transmittance of greater than or equal to about 85%, for example, greater than or equal to about 88%, greater than or equal to about 90%, greater than or equal to about 95%, greater than or equal to about 97%, or greater than or equal to about 99% for light in a predetermined wavelength (e.g., light emitted from a quantum dot). The thickness of the substrate may be appropriately selected in consideration of the substrate material, the desired overall thickness, and the like, and is not particularly limited. The transparent substrate may be a flexible substrate, e.g., a flexible polymer substrate. As shown, the substrate may be omitted.

One of the first electrode 11 or the second electrode 15 is an anode, and the other is a cathode. For example, the first electrode 11 may be an anode and the second electrode 15 may be a cathode.

The first electrode 11 may be made of a conductor, for example, a metal, a conductive metal oxide, or a combination thereof. The first electrode 11 may be, for example, made of a metal or an alloy thereof such as nickel, platinum, vanadium, chromium, copper, zinc, or gold; a conductive metal oxide such as zinc oxide, indium oxide, tin oxide, indium tin oxide (ITO), indium zinc oxide (IZO), or a fluorine-doped tin oxide; or a combination of metal and oxide such as ZnO and Al or $SnO_2$ and Sb, but is not limited thereto. For example, the first electrode 11 may include a transparent conductive metal oxide, for example, indium tin oxide (ITO).

The second electrode 15 may be made of a conductor, for example, a metal, a conductive metal oxide, and/or a conductive polymer. The second electrode 15 may be for example a metal or an alloy thereof such as aluminum, magnesium, calcium, sodium, potassium, titanium, indium, yttrium, lithium, gadolinium silver, tin, lead, cesium, and barium, a multi-layer structure material such as LiF/Al, LiO$_2$/Al, Liq/Al, LiF/Ca, and BaF$_2$/Ca, but is not limited thereto. The conductive metal oxide is the same as described above.

One of the first electrode 11, or the second electrode 15, may be a light-transmitting electrode, and the light-transmitting electrode may be, for example, made of a conductive oxide such as a zinc oxide, indium oxide, tin oxide, indium tin oxide (ITO), indium zinc oxide (IZO), or fluorine doped tin oxide, or a metal thin layer of a single layer or a multi-layer. When one of the first electrode 11, or the second electrode 15, is a non-light-transmitting electrode, it may be made of for example an opaque conductor such as aluminum (Al), silver (Ag), or gold (Au).

The thickness of the first electrode 11 and/or the second electrode 15 is not particularly limited, and may be appropriately selected in consideration of device efficiency. For example, the thickness of the first and/or second electrode may be greater than or equal to 5 nanometers (nm), for example, greater than or equal to about 50 nm. For example, the thickness of the first and/or second electrode may be less than or equal to about 100 micrometers (μm), for example, less than or equal to about 10 μm, less than or equal to about 1 μm, less than or equal to about 900 nm, less than or equal to about 500 nm, or less than or equal to about 100 nm.

In the light emitting device according to an embodiment, the driving voltage and device efficiency may be increased due to a reduction of the hole leakage current of the electron transport layer. Moreover, hole blocking of the electron transport layer may also be more effective as the electron mobility is increased resulting in an increase of device luminance. Also, the interfacial charge between the light emitting layer and the electron transport layer including quantum dots may be addressed resulting in a decrease in device deterioration and increasing life-span.

The light emitting layer 13 includes a plurality of quantum dots. The quantum dots (hereinafter, also referred to as 'semiconductor nanocrystals') may include a Group II-VI compound, a Group III-V compound, a Group IV-VI compound, a Group IV element or compound, a Group I-III-VI compound, a Group I-II-IV-VI compound, or a combination thereof.

The Group II-VI compound may be a binary element compound of CdSe, CdTe, ZnS, ZnSe, ZnTe, ZnO, HgS, HgSe, HgTe, MgSe, MgS, and a mixture thereof; a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a mixture thereof; or a quaternary element compound of HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof. The Group II-VI compound may further include a Group III metal. The Group III-V compound may be a binary element compound of GaN, GaP, GaAs, GaSb, AlN, AlP, AlAs, AlSb, InN, InP, InAs, InSb, or a mixture thereof; a ternary element compound of GaNP, GaNAs, GaNSb, GaPAs, GaPSb, AlNP, AlNAs, AlNSb, AlPAs, AlPSb, InNP, InNAs, InNSb, InPAs, InPSb, or a mixture thereof; or a quaternary element compound of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, or a mixture thereof. The Group III-V compound may further include a Group II metal (e.g., InZnP). The Group IV-VI compound may be a binary element compound of SnS, SnSe, SnTe, PbS, PbSe, PbTe, or a mixture thereof; a ternary element compound of SnSeS, SnSeTe, SnSTe, PbSeS, PbSeTe, PbSTe, SnPbS, SnPbSe, SnPbTe, or a mixture thereof; or a quaternary element compound of SnPbSSe, SnPbSeTe, SnPbSTe, or a mixture thereof. Examples of the Group I-III-VI compound include CuInSe$_2$, CuInS$_2$, CuInGaSe, or CuInGaS, but are not limited thereto. Examples of the Group I-II-IV-VI group compound include CuZnSnSe or CuZnSnS, but are not limited thereto. The Group IV element or compound may be a single element of Si, Ge, or a mixture thereof; or a binary compound of SiC, SiGe, or a mixture thereof.

In an embodiment, the quantum dots may not include cadmium. The quantum dots may include semiconductor nanocrystals based on a Group III-V compound including indium and phosphorus. The Group III-V compound may further include zinc. The quantum dots may include a semiconductor nanocrystal based on a Group II-VI compound including a chalcogen element (e.g., sulfur, selenium, tellurium, or a combination thereof) and zinc.

In the quantum dots, the aforementioned binary element compound(s), ternary element compound(s), and/or quaternary element compound(s) may exist in a uniform concentration in a particle or have different concentration distributions in the same particle. The semiconductor nanocrystal may have a core-shell structure in which a first semiconductor nanocrystal (core) is surrounded by a second semiconductor nanocrystal (shell) of the same or different composition. As an example, the quantum dots may include a core including InP, InZnP, ZnSe, ZnSeTe, or a combination thereof, and a shell (or a multi-layered shell) having a composition different from the core, and including InP, InZnP, ZnSe, ZnS, ZnSeTe, ZnSeS, or a combination thereof.

The interface between the core and the shell may have a concentration gradient in which the concentration of an element present in the core or the shell decreases toward the center of the core nanocrystal. In addition, the semiconductor nanocrystal may have a structure including one semiconductor nanocrystal core and a multi-layered shell surrounding the semiconductor nanocrystal core. In this case, the multi-layered shell structure has a shell structure of two or more layers, and each layer may have a single composition or alloy. Moreover, a shell layer may have a concentration gradient of one or more chemical components.

The quantum dots may include a shell material and a core material having different energy band gaps. For example, the energy band gap of the shell material may be greater than the energy band gap of the core material. Alternatively, the energy band gap of the shell material may be less than the energy band gap of the core material.

The quantum dots may have a multi-layered shell. In the multi-layered shell, the energy band gap of the outer shell layer may be greater than the energy band gap of the inner shell layer (i.e., a layer close to the core). In the multi-layered shell, the energy band gap of the outer shell layer may be less than the energy band gap of the inner shell layer.

The quantum dots may adjust the absorption/emission wavelength by adjusting the composition and size of the nanocrystal. The maximum emission peak wavelength of a quantum dot may have a wavelength range from ultraviolet to infrared or higher. For example, the maximum emission peak wavelength of a quantum dot may be greater than or equal to about 300 nm, for example, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum emission wavelength of a quantum dot may be in the range of less than or equal to about 800 nm, for example, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum emission wavelength of a quantum dot may be in the range of about 500 nm to about 650 nm. The maximum emission wavelength of a quantum dot may be in the range of about 500 nm to about 540 nm. The maximum emission wavelength of a quantum dot may be in the range of about 610 nm to about 640 nm.

The quantum dot may have a quantum efficiency of greater than or equal to about 10 percent (%), for example, greater than or equal to about 30%, greater than or equal to about 50%, greater than or equal to about 60%, greater than or equal to about 70%, greater than or equal to about 90%, or even about 100%. The quantum dot may have a relatively narrow emission spectrum. The quantum dot may have a full width at half maximum (FWHM) of the emission wavelength spectrum of, for example, less than or equal to about 50 nm, for example less than or equal to about 45 nm, less than or equal to about 40 nm, or less than or equal to about 30 nm.

The quantum dots may have an average particle size of greater than or equal to about 1 nm and less than or equal to about 100 nm (e.g., a diameter or a longest length of a straight line across the particles). The quantum dots may have an average particle size of about 1 nm to about 20 nm, for example, greater than or equal to about 2 nm, greater than or equal to about 3 nm, or greater than or equal to about 4 nm and less than or equal to about 50 nm, less than or equal to about 40 nm, less than or equal to about 30 nm, less than or equal to about 20 nm, less than or equal to about 15 nm, or less than or equal to about 10 nm. The shape of the quantum dots are not particularly limited. For example, the shapes of the quantum dots may include a sphere, a polyhedron, a pyramid, a multi-pod, a square, a rectangular parallelepiped, a nanotube, a nanorod, a nanowire, a nanosheet, or a combination thereof, but are not limited thereto.

As used herein, an average particle size (e.g., metal oxide particles and quantum dot particles) may be obtained from commercially available image analysis programs (e.g., image J) using images obtained from electron microscopy analysis (two-dimensional images). The average may be mean, mode, or median.

The quantum dots may be commercially available or may be appropriately synthesized. When quantum dots are colloid-synthesized, the particle size may be controlled, e.g., uniformly controlled.

The quantum dot may include for example an organic ligand having a hydrophobic moiety. The organic ligand moiety may be bound to a surface of the quantum dot. The organic ligand may include RCOOH, $RNH_2$, $R_2NH$, $R_3N$, RSH, $R_3PO$, $R_3P$, ROH, RCOOR, $RPO(OH)_2$, RHPOOH, $R_2POOH$, or a combination thereof, wherein R is independently a C3 (or C5) to C24 substituted or unsubstituted aliphatic hydrocarbon group such as a C3 (or C5) to C24 alkyl or alkenyl group, a C6 to C20 substituted or unsubstituted aromatic hydrocarbon group such as a C6 to C20 aryl group, or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, benzyl thiol, and the like; an amine such as methane amine, ethane amine, propane amine, butane amine, pentyl amine, hexyl amine, octyl amine, nonyl amine, decyl amine, dodecyl amine, hexadecyl amine, octadecyl amine, dimethyl amine, diethyl amine, dipropyl amine, tributyl amine, trioctyl amine, and the like; a carboxylic acid such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and the like; a phosphine compound such as methyl phosphine, ethyl phosphine, propyl phosphine, butyl phosphine, pentyl phosphine, octylphosphine, dioctyl phosphine, tributylphosphine, trioctylphosphine, and the like; a phosphine compound or an oxide compound thereof such as methylphosphine oxide, ethylphosphine oxide, propylphosphine oxide, butylphosphine oxide pentylphosphineoxide, tributylphosphine oxide, octylphosphine oxide, dioctylphosphine oxide, trioctylphosphine oxide; or diphenylphosphine, triphenylphosphine, or an oxide compound thereof; a C5 to C20 alkylphosphonic acid, a C5 to C20 alkylphosphonic acid, and the like such as hexylphosphinic acid, octylphosphinic acid, dodecanephosphinic acid, tetradecanephosphinic acid, hexadecanephosphinic acid, or octadecanephosphinic acid, but are not limited thereto. The quantum dot may include the organic ligand alone or as a mixture of one or more organic ligands. The organic ligand may not include a photo-polymerizable moiety such as an acrylate group or a methacrylate group.

For example, the light emitting layer 13 may include a monolayer of the quantum dots. Alternatively, the light emitting layer 13 may include one or more, for example, 2 layers or more, 3 layers or more, or 4 layers or more, and 20 layers or less, 10 layers or less, 9 layers or less, 8 layers or less, 7 layers or less, or 6 layers or less of the monolayer of the quantum dots. The light emitting layer 13 may have a thickness of greater than or equal to about 5 nm, for example, greater than or equal to about 10 nm, greater than or equal to about 20 nm, or greater than or equal to about 30 nm, and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The light emitting layer 13 may have a thickness of, for example about 10 nm to about 150 nm, about 10 nm to about 100 nm, or about 10 nm to about 50 nm.

The light emitting layer 13 may have a HOMO energy level of greater than or equal to about 5.4 electron volts (eV), greater than or equal to about 5.6 eV, greater than or equal to about 5.7 eV, greater than or equal to about 5.8 eV, greater than or equal to about 5.9 eV, or greater than or equal to about 6.0 eV. The light emitting layer 13 may have a HOMO energy level of less than or equal to about 7.0 eV, less than or equal to about 6.8 eV, less than or equal to about 6.7 eV, less than or equal to about 6.5 eV, less than or equal to about 6.3 eV, or less than or equal to about 6.2 eV. For example, the light emitting layer 13 may have a HOMO energy level of about 5.6 eV to about 6.0 eV.

The light emitting layer 13 may have a LUMO energy level of less than or equal to about 3.8 eV, for example, less than or equal to about 3.7 eV, less than or equal to about 3.6 eV, less than or equal to about 3.5 eV, less than or equal to about 3.4 eV, less than or equal to about 3.3 eV, less than or equal to about 3.2 eV, or less than or equal to about 3.0 eV. The light emitting layer 13 may have a LUMO energy level of greater than or equal to about 2.5 eV. For example, the light emitting layer 13 may have an energy band gap of about 2.4 eV to about 2.9 eV.

A hole auxiliary layer 12 may be disposed between the first electrode 11 and the light emitting layer 13. The hole auxiliary layer 12 may be one layer, or two or more layers, and may include, for example, a hole injection layer, a hole transport layer, and/or an electron blocking layer.

The hole auxiliary layer 12 may have a HOMO energy level that is matched with the HOMO energy level of the light emitting layer 13, and may enhance mobility of holes transferred from the hole auxiliary layer 12 to the light emitting layer 13.

The HOMO energy level of the hole auxiliary layer 12 (e.g., hole transport layer) contacting the light emitting layer 13 may be the same as or smaller than the HOMO energy level of the light emitting layer 13, for example, if different, then within a range of less than or equal to about 1.0 eV. For example, a difference of HOMO energy levels between the hole auxiliary layer 12 and the light emitting layer 13 may be 0 eV to about 1.0 eV, for example about 0.01 eV to about 0.8 eV, about 0.01 eV to about 0.7 eV, about 0.01 eV to about 0.5 eV, about 0.01 eV to about 0.4 eV, about 0.01 eV to about 0.3 eV, about 0.01 eV to about 0.2 eV, or about 0.01 eV to about 0.1 eV.

The HOMO energy level of the hole auxiliary layer 12 may be, for example, greater than or equal to about 5.0 eV, for example, greater than or equal to about 5.2 eV, greater than or equal to about 5.4 eV, greater than or equal to about 5.6 eV, or greater than or equal to about 5.8 eV. For example, the HOMO energy level of the hole auxiliary layer 12 may be about 5.0 eV to about 7.0 eV, for example about 5.2 eV to about 6.8 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.2 eV, or about 5.8 eV to about 6.1 eV.

For example, the hole auxiliary layer 12 may include a hole injection layer proximate to the first electrode 11, and a hole transport layer proximate to the light emitting layer 13. Herein, the HOMO energy level of the hole injection layer may be about 5.0 eV to about 6.0 eV, about 5.0 eV to about 5.5 eV, or about 5.0 eV to about 5.4 eV and the HOMO energy level of the hole transport layer may be about 5.2 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, or about 5.4 eV to about 6.1 eV.

A material included in the hole auxiliary layer 12 is not particularly limited and may include, for example, poly(9,9-dioctyl-fluorene-co-N-(4-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis(4-methoxyphenyl)-benzidine (TPD), 4-bis[N-(1-naphthyl)-N-phenyl-amino] biphenyl (α-NPD), m-MTDATA (4,4',4''-tris[phenyl(m-tolyl)amino]triphenylamine), 4,4',4''-tris(N-carbazolyl)-triphenylamine (TCTA), 1,1-bis[(di-4-tolylamino) phenylcyclohexane (TAPC), p-type metal oxide (e.g., NiO, WO$_3$, MoO$_3$, etc.), a carbon-based material such as graphene oxide, or a combination thereof, but is not limited thereto.

In the hole auxiliary layer(s), a thickness of each layer may be appropriately selected. For example, the thickness of each layer may be greater than or equal to about 10 nm, for example, greater than or equal to about 15 nm, greater than or equal to about 20 nm and less than or equal to about 100 nm, for example, less than or equal to about 90 nm, less than or equal to about 80 nm, less than or equal to about 70 nm, less than or equal to about 60 nm, or less than or equal to about 50 nm, but is not limited thereto.

The electron auxiliary layer 14 is disposed between the light emitting layer 13 and the second electrode 15. The electron auxiliary layer 14 may include for example an electron injection layer, an electron transport layer, and/or a hole blocking layer, but is not limited thereto.

For example, the electron auxiliary layer 14 may be an electron transport layer. The electron auxiliary layer 14 may include metal oxide nanoparticles.

The metal oxide may be an oxide of a metal including Zn, Mg, Ca, Zr, W, Li, Ti, Y, Al, or a combination thereof.

For example, the metal oxide may be represented by Chemical Formula 1.

$$Zn_{1-x}M_xO$$ <span style="float:right">Chemical Formula 1</span>

In Chemical Formula 1, M may be Mg, Ca, Zr, W, Li, Ti, Y, Al, or a combination thereof, and may be for example, Mg. In Chemical Formula 1, the x may be greater than or equal to 0 and less than or equal to about 0.5, for example greater than or equal to about 0.01 and less than or equal to about 0.3, or greater than or equal to about 0.01 and less than or equal to about 0.15.

For example, the metal oxide may include zinc oxide, zinc magnesium oxide, or a combination thereof.

The electron auxiliary layer 14 may include an organic ligand attached to a surface of the metal oxide nanoparticles.

The organic ligand may have different properties from the ligand attached to the aforementioned quantum dots. For example, in the case of the ligands attached to the quantum dots, the ligands have a hydrophobic moiety, whereas in the case of the organic ligands attached to the metal oxide nanoparticles, the ligands may have a hydrophilic moiety. In this manner, because the ligands attached to the quantum dots have different properties from the organic ligands attached to the metal oxide nanoparticles, and even though the electron auxiliary layer 14 is formed on the light emitting layer 13 by using a solution process, damage to the light emitting layer 13 by a solvent in a composition for forming the electron auxiliary layer may be minimized.

Examples of the hydrophilic organic ligand may include a carboxylate moiety. The carboxylate moiety may include, for example, an acetate moiety, a propionate moiety, an acrylate moiety, or a combination thereof.

The nanoparticles may have an average particle size of greater than or equal to about 1 nm, for example, greater than or equal to about 1.5 nm, greater than or equal to about 2 nm, greater than or equal to about 2.5 nm, or greater than or equal to about 3 nm and less than or equal to about 100 nm, for example less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, less than or equal to about 20 nm, less than or equal to about 10 nm, less than or equal to about 9 nm, less than or equal to about 8 nm, less than or equal to about 7 nm, less than or equal to about 6 nm, or less than or equal to about 5 nm. The nanoparticles may not have a rod shape, or a nanowire shape.

An absolute value of LUMO of the quantum dots may be smaller than an absolute value of LUMO of the metal oxide. An absolute value of LUMO of the quantum dots may be greater than an absolute value of LUMO of the metal oxide.

The metal oxide may have a LUMO absolute value of greater than or equal to about 2 eV, greater than or equal to about 2.5 eV, greater than or equal to about 3 eV, greater than or equal to about 3.5 eV, or greater than or equal to about 4 eV and less than or equal to about 5 eV, less than or equal to about 4.5 eV, less than or equal to about 4 eV, less than or equal to about 3.5 eV, or less than or equal to about 3 eV.

The metal oxide may have a HOMO absolute value of greater than or equal to about 5 eV, greater than or equal to about 5.5 eV, greater than or equal to about 6 eV, greater than or equal to about 6.5 eV, or greater than or equal to about 7 eV and less than or equal to about 8 eV, less than or equal to about 7.5 eV, less than or equal to about 7 eV, less than or equal to about 6.5 eV, or less than or equal to about 6 eV.

The metal oxide may have an energy bandgap of greater than or equal to about 2 eV, greater than or equal to about 2.5 eV, greater than or equal to about 3 eV, greater than or equal to about 3.5 eV, or greater than or equal to about 4 eV and less than or equal to about 5 eV, less than or equal to about 4.5 eV, less than or equal to about 4 eV, less than or equal to about 3.5 eV, or less than or equal to about 3 eV.

In the light emitting device 10, holes and electrons injected from the first electrode 11 and the second electrode 15, respectively, are combined with each other in the light emitting layer 13 including the quantum dots to form excitons, which then emit light.

The common layer (e.g., an electron auxiliary layer such as an electron injection layer (EIL), an electron transport layer (ETL), and the like, or a hole auxiliary layer such as a hole injection layer (HIL), a hole transport layer (HTL), and the like), that is present between the light emitting layer 13 and the second electrode 15 and the first electrode, respectively, for smooth injection of electrons and holes according to the voltage application, and the electron auxiliary layer 14, for example, the electron transport layer (ETL), has sufficient electron mobility capable of balancing holes-electrons in the light emitting layer 13, and thus plays a role of efficiently transferring the electrons from the second electrode 15 to the quantum dot light emitting layer 13. In addition, the electron auxiliary layer 14 has an appropriately deep HOMO energy level and also serves to sufficiently block the holes that may migrate from the quantum dot light emitting layer 13.

For example, if the electron auxiliary layer includes metal oxide nanoparticles the electron auxiliary layer may have improved electron mobility in comparison to an organic semiconductor material widely used as an electron transport layer (ETL) in an OLED. However, because the holes may move relatively easily through defects of the nanoparticles, the electron auxiliary layer may have a relatively high leakage current, and this high leakage current may eventually decrease efficiency of a quantum dot light emitting device. In addition, organic materials derived from various organic-inorganic precursors used in the synthesis of the metal oxide nanoparticles may act as an insulator on the nanoparticle surface or among the nanoparticles to reduce electron mobility resulting in charge accumulation at the interface of the quantum dot light emitting layer and the electron auxiliary layer, which, in turn, results in a decrease in luminance and/or a life-span of the quantum dot light emitting device.

Accordingly, when metal oxide nanoparticles are present in an electron auxiliary layer, relatively poor hole blocking characteristics resulting from the defects of the metal oxide nanoparticles may cause a higher leakage current, which may decrease device efficiency. In addition, any organic materials that remain present on the surfaces of the metal oxide nanoparticles, and/or at the interface of the light emitting layer and the electron auxiliary layer, may cause a reduction in electron mobility, and thus, a decrease in luminance, resulting in deteriorating characteristics of the device due to a charging phenomenon as noted above. To address the technical disadvantages of including metal oxide nanoparticles in an electron auxiliary layer, a surface treatment for the oxide nanoparticles has been developed.

The electron auxiliary layer 14 (e.g., an electron transport layer (ETL)) of the light emitting device 10 according to an embodiment includes metal oxide nanoparticles surface-treated with a base including a hydroxyl group (OH). The base including the hydroxyl group may passivate the defects in the surfaces of the metal oxide nanoparticle, and thereby, provide metal oxide nanoparticles having higher conductivity and less defects. In addition, the resulting electron auxiliary layer 14 has a reduced leakage current and electron accumulation may be reduced or eliminated, thereby increasing efficiency and life-span of the light emitting device 10.

Figure 2:
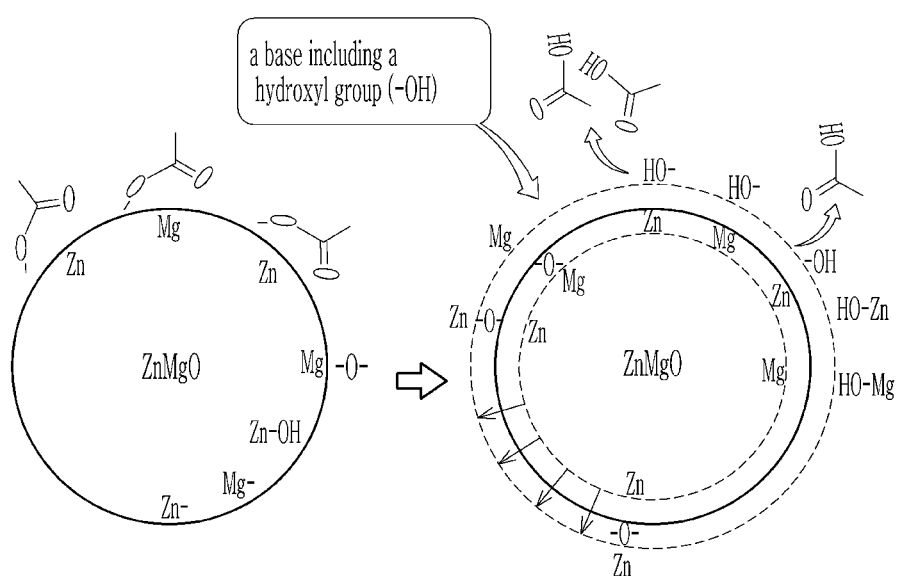
FIG. 2 is a schematic representation of a process showing metal oxide nanoparticles undergoing surface-treatment with a base including a hydroxyl group.

FIG. 2 is a schematic representation of a metal oxide nanoparticle that is surface-treated with the base including the hydroxy group. FIG. 2 exemplifies the case in which the metal oxide nanoparticle is ZnMgO, but the present disclosure is not limited thereto.

Referring to FIG. 2, the ZnMgO nanoparticle grows through a sol-gel (sol-gel) dehydration condensation reaction between a precursor (e.g., $Zn(CH_3OOO)_2$, $Mg(CH_3OOO)_2$) and a base (e.g., tetramethylammonium hydroxide, TMAH, etc.). Surface species such as $Zn^{2+}$, $Mg^{2+}$, $O^{2-}$, —OH, or $CH_3OOO^-$, and the like may remain on the surface of the synthesized nanoparticle, which may then act as a surface defect that serves as a hole trap site when driving a light emitting device. This may cause a problem of generating leakage current.

When treating the surface of the ZnMgO nanoparticles with the base including the hydroxyl group, the number of surface defects may be reduced through the additional chemical reaction on the surface of the ZnMgO nanoparticles. For example, when a base including a hydroxyl group (OH—) comes in contact with the surface of the ZnMgO nanoparticle, for example, by a condensation reaction of Zn—O—Zn(Mg) and $Zn(OH)_4^{2-}$, additional growth of ZnO or MgO proceeds on the surface defect site. The result is a decrease in trap sites by passivating the surface defect of the ZnMgO nanoparticle. As a result, a luminous efficiency of the light emitting device 10 may be enhanced by hole blocking effects of suppressing current leakage of a hole generated through a trap site of ZnMgO present around a HOMO level of the quantum dot.

The electron auxiliary layer 14 may have a value $R_{C—O/C=O}$ obtained in Formula 1 of greater than or equal to about 0.95, for example, greater than or equal to about 0.96, greater than or equal to about greater than or equal to about 0.97, greater than or equal to about 0.98, greater than or equal to about 0.99, or greater than or equal to about 1.0, and less than or equal to about 2.0, for example less than or equal to about 1.9, less than or equal to about 1.8, less than or equal to about 1.7, less than or equal to about 1.6, less than or equal to about 1.5, less than or equal to about 1.4, less than or equal to about 1.3, less than or equal to about 1.2, or less than or equal to about 1.1, or for example about 0.95 to about 2.0, about 0.96 to about 1.9, about 0.97 to about 1.8, about 0.98 to about 1.7, about 0.99 to about 1.6, or about 1.0 to about 1.5.

$$R_{C-O/C=O} = I_{C-O}/I_{C=O} \qquad \text{Formula 1}$$

In Formula 1, $I_{C-O}$ is a C—O group peak intensity, and $I_{C=O}$ is a C=O group peak intensity, in a Fourier transform infrared spectroscopy spectrum of the electron auxiliary layer.

The infrared spectroscopy analysis is performed using a Fourier Transform Varian 670-IR (Agilent, Harrick Seagull variable angle accessory) equipment, in an internal reflection (Hemisphere ATR) mode, under the condition of 4000 $cm^{-1}$ to 650 $cm^{-1}$ range, 128 scans or more, Ge crystal, and an incident angle of 64 degrees.

In the infrared spectroscopy spectrum, the CO group peak may be obtained at a wavelength of about 1400 $cm^{-1}$ to about 1450 $cm^{-1}$, and the C=O group peak may be obtained at a wavelength of about 1550 cm-1 to about 1600 $cm^{-1}$.

In Formula 1, the $R_{C-O/C=O}$ is an intensity ratio of the C—O group to the C=O group in the electron auxiliary layer 14. As the surface-treatment of the metal oxide nanoparticles with the base including the hydroxyl group, the CO group peak intensity and the C=O group peak intensity both decrease, however, the ratio at which the peak intensity of the C=O group decreases is greater than the ratio at which the CO group peak intensity decreases, and thus, a value of the $R_{C-O/C=O}$ exceeding about 0.91 may be obtained.

When the $R_{C-O/C=O}$ exceeds about 0.91, following the surface treatment with base including a hydroxyl group to the surface of the metal oxide nanoparticles, the surface defects of the metal oxide nanoparticles may be passivated or, in some instances, removed, and the metal oxide nanoparticles are additionally grown, and/or residual organic materials present between the metal oxide nanoparticles is shown to decrease, resulting in an increase of device efficiency, an increase in luminance, and/or an increase in life-span of the light emitting device 10.

In the electron auxiliary layer, a value $R_{N-CH3/C=O}$ obtained in Formula 2 may be greater than or equal to about 0.45, for example greater than or equal to about 0.5, greater than or equal to about 0.55, greater than or equal to about 0.7, greater than or equal to about 0.8, or greater than or equal to about 0.9 and less than or equal to about 0.9, for example less than or equal to about 0.89, less than or equal to about 0.72, or less than or equal to about 0.56, or about 0.45 to about 0.9, for example about 0.55 to about 0.89, about 0.71 to about 0.89, or about 0.80 to about 0.89.

$$R_{N-CH3/C=O} = I_{N-CH3}/I_{C=O} \qquad \text{Formula 2}$$

In Formula 2, $I_{N-CH3}$ is an N—$CH_3$ group peak intensity, and $I_{C=O}$ is a C=O group peak intensity as defined in Formula 1, in a Fourier transform infrared spectroscopy spectrum. In the infrared spectroscopy spectrum, the peak of the N—$CH_3$ group may be obtained at a wavelength of about 955 $cm^{-1}$ to about 1490 $cm^{-1}$.

In addition, in the electron auxiliary layer, the value $R_{N-CH3/C-O}$ obtained in Formula 3 may be greater than or equal to about 0.50, for example greater than or equal to about 0.58, greater than or equal to about 0.68, greater than or equal to about 0.70, or greater than or equal to about 0.76 and less than or equal to about 0.80, for example less than or equal to about 0.77, less than or equal to about 0.69, or less than or equal to about 0.59, or about 0.50 to about 0.80, for example about 0.58 to about 0.77, about 0.68 to about 0.77, or about 0.70 to about 0.77.

$$R_{N-CH3/C-O} = I_{N-CH3}/I_{C-O} \qquad \text{Formula 3}$$

In Formulas 2 and 3, the values $R_{N-CH3/C=O}$ or $R_{N-CH3/C-O}$, respectively, is an intensity ratio of the N—$CH_3$ group to the C=O or C—O group in the electron auxiliary layer 14. As the surface-treatment of the metal oxide nanoparticles with a base including a hydroxyl group and the N—$CH_3$ group (e.g., tetramethylammonium hydroxide, etc.), the CO group peak intensity and the C=O group peak intensity decreases, and the N—$CH_3$ group peak intensity increases, and thus, values of $R_{N-CH3/C=O}$ and $R_{N-CH3/C-O}$ of greater than or equal to about 0.45 and greater than or equal to about 0.50 may be obtained, respectively.

When the $R_{N-CH3/C=O}$ and $R_{N-CH3/C-O}$ are greater than or equal to about 0.45 and greater than or equal to about 0.50, respectively, following surface treatment with a base including a hydroxyl group of the metal oxide nanoparticles, the surface defects of the metal oxide nanoparticles may be passivated, and in some instances, removed, the metal oxide nanoparticles are additionally grown, and residual organic materials present between the metal oxide nanoparticles is shown to decrease, resulting in an increase of device efficiency, an increase in luminance, and/or an increase in life-span of the light emitting device 10.

For example, in the electron auxiliary layer 14, a mole ratio of the carbon atoms to the metal atoms of the metal oxide nanoparticles may be less than or equal to about 1.5:1, for example less than or equal to about 1.4:1, less than or equal to about 1.3:1, less than or equal to about 1.2:1, less than or equal to about 1.1:1, less than or equal to about 1.0:1, less than or equal to about 0.9:1, less than or equal to about 0.8:1, less than or equal to about 0.7:1, less than or equal to about 0.6:1, less than or equal to about 0.5:1, less than or equal to about 0.4:1, less than or equal to about 0.3:1, less than or equal to about 0.2:1, less than or equal to about 0.1:1, or even 0.

The mole ratio of carbon atoms to metal atoms in the electron auxiliary layer 14 may be measured by X-ray photoelectron spectroscopy (XPS) analysis under the conditions of an acceleration voltage of about 0.5 keV to about 15 keV, about 300 W, and a minimum analysis area of 200×200 $\mu m^2$ using a Quantum 2000 device of Physical Electronics. In addition, when the electron auxiliary layer 14 further includes the electron injection layer or the hole blocking layer in addition to the electron transport layer, the mole ratio of carbon atoms may be measured based on the electron transport layer alone.

Figure 3:
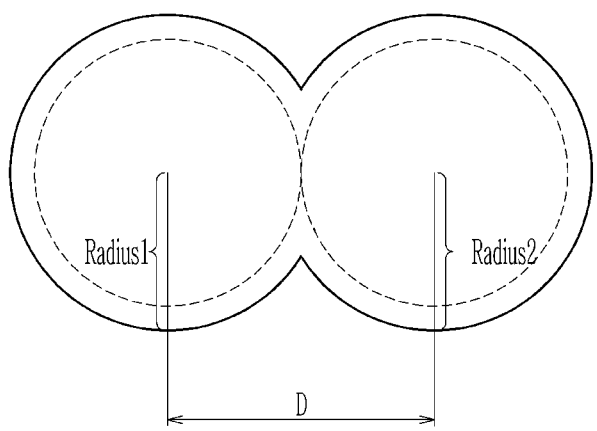
FIG. 3 is a schematic illustration of adjacent metal oxide nanoparticles adjacent in the electron auxiliary layer and the center-to-center distance D.

FIG. 3 is a schematic illustration of adjacent metal oxide nanoparticles with a center-to-center distance D included in the electron auxiliary layer 14.

Referring to FIG. 3, when a thin film including the plurality of metal oxide nanoparticles is surface-treated with the base including a hydroxyl group, as described above, a hydroxyl group is supplied to a surface of the metal oxide nanoparticles, the metal oxide nanoparticles grow additionally, and a contact area between the metal oxide nanoparticles expands, thereby improving the conductivity of the metal oxide nanoparticles. Accordingly, the electron auxiliary layer 14 may satisfy Formula 4.

$$D < \text{Radius1} + \text{Radius2} \qquad \text{Formula 4}$$

In Formula 4, D is a center to-center distance between the first metal oxide nanoparticle and the adjacent second metal oxide nanoparticle, and Radius1 and Radius2 are radii of the first metal oxide nanoparticle and the second metal oxide nanoparticle, respectively.

As used herein, the radius and the center-to-center distance of the metal oxide nanoparticles may be obtained from a commercialized image analysis program (e.g., image J) using an image (two-dimensional image) obtained from electron microscopic analysis. For example, a radius of a metal oxide nanoparticle may be half the diameter or the longest length of a straight line crossing the particle, and the center of the metal oxide nanoparticle may be a center of gravity or a point where the longest straight line and the shortest straight line which cross the metal oxide nanoparticles meet.

When the electron auxiliary layer 14 satisfies Formula 4, the electron auxiliary layer 14 includes metal oxide nanoparticles adjacent to each other whose sum of radii is greater than the distance between the respective center-to-center distance. Accordingly, the electron conductivity of the electron auxiliary layer 14 may be improved, and the efficiency of the light emitting device 10 including the electron auxiliary layer 14 may be improved.

In addition, as the content of residual organic materials acting as an insulator on the surface of the metal oxide nanoparticles decreases, the interfacial charging between the light emitting layer 13 including the quantum dots and the electron auxiliary layer 14 is addressed, thereby improving performance and increasing life-span of a device.

For example, electrical conductivity of the electron auxiliary layer 14 may be greater than about $6.5 \times 10^{-8}$ siemens per centimeter (S/cm), for example greater than about $7.0 \times 10^{-8}$ S/cm, greater than about $7.5 \times 10^{-8}$ S/cm, greater than about $8.0 \times 10^{-8}$ S/cm, greater than about $8.5 \times 10^{-8}$ S/cm, greater than about $9.0 \times 10^{-8}$ S/cm, greater than about $9.5 \times 10{-8}$ S/cm, or greater than about $10 \times 10^{-8}$ S/cm, and less than about 1.0 S/cm, for example less than about 0.1 S/cm, less than about 0.01 S/cm, or less than about $1.0 \times 10^{-3}$ S/cm, or greater than about $6.5 \times 10^{-8}$ S/cm and less than about $1.0 \times 10^{-3}$ S/cm, for example greater than about $7.0 \times 10^{-8}$ S/cm and less than about $1.0 \times 10^{-3}$ S/cm, greater than about $7.5 \times 10^{-8}$ S/cm and less than about $1.0 \times 10^{-3}$ S/cm, greater than about $8.0 \times 10^{-8}$ S/cm and less than about $1.0 \times 10^{-3}$ S/cm, greater than about $8.5 \times 10{-8}$ S/cm and less than about $1.0 \times 10^{-3}$ S/cm, greater than about $9.0 \times 10^{-8}$ S/cm and less than about $1.0 \times 10^{-3}$ S/cm, greater than about $9.5 \times 10^{-8}$ S/cm and less than about $1.0 \times 10^{-3}$ S/cm, or greater than about $10 \times 10^{-8}$ S/cm and less than about $1.0 \times 10^{-3}$ S/cm. In addition, when the electron auxiliary layer 14 further includes the electron injection layer or the hole blocking layer in addition to the electron transport layer, the electrical conductivity may be the electrical conductivity of the electron transport layer.

A thickness of the electron auxiliary layer 14 may be appropriately selected in consideration of the emission wavelength of the quantum dots, the thickness of the light emitting layer 13, or the composition and thickness of the hole auxiliary layer 12. For example, the quantum dots of the light emitting layer 13 emit light having a maximum emission wavelength of about 600 nm to 640 nm, and the thickness of the electron auxiliary layer 14 may be greater than or equal to about 20 nm, for example, greater than or equal to about 25 nm, greater than or equal to about 30 nm, greater than or equal to about 35 nm, greater than or equal to about 40 nm, or greater than or equal to about 45 nm, and less than or equal to about 80 nm, for example, less than or equal to about 75 nm, less than or equal to about 70 nm, less than or equal to about 65 nm, less than or equal to about 60 nm, or less than or equal to about 55 nm. For example, the quantum dots emit light having a maximum emission wavelength of less than or equal to about 500 nm, e.g., for example 420 nm to 500 nm, and the thickness of the electron auxiliary layer 14 may be greater than or equal to about 60 nm, for example, greater than or equal to about 65 nm, greater than or equal to about 70 nm, or greater than or equal to about 75 nm, and less than or equal to about 120 nm, for example, less than or equal to about 115 nm, less than or equal to about 110 nm, less than or equal to about 105 nm, less than or equal to about 100 nm, less than or equal to about 95 nm, or less than or equal to about 90 nm.

Another embodiment relates to a method of manufacturing the aforementioned light emitting device.

The method of manufacturing the light emitting device includes forming an electron auxiliary layer including a plurality of metal oxide nanoparticles, and contacting the plurality of metal oxide nanoparticles with a base including a hydroxyl group (OH).

The method of manufacturing a light emitting device may further include providing or forming a first electrode, forming a light emitting layer including the quantum dots, and, optionally, a hole auxiliary layer. A specific method of forming the first electrode, the light emitting layer including the quantum dots, and optional, hole auxiliary layer on the aforementioned substrate may be appropriately selected and is not particularly limited. The aforementioned hole auxiliary layer and the aforementioned light emitting layer may be formed by, for example, a solution process, for example, spin coating, slit coating, inkjet printing, nozzle printing, spraying and/or doctor blade coating, but the present disclosure is limited thereto.

A method of forming the electron auxiliary layer including the metal oxide nanoparticles may be appropriately selected and is not particularly limited. For example, the electron auxiliary layer may be formed by a solution process using a solution including the metal oxide nanoparticles. For example, it may be formed by spin coating, bar coating, spray coating, slit coating, inkjet printing, nozzle printing, spraying, or doctor blade coating of the solution prepared by the sol-gel method of the metal oxide nanoparticles, but is not limited thereto.

The contacting of the plurality of metal oxide nanoparticles with the base including a hydroxyl group may include preparing a solution by dissolving the base including the hydroxyl group in a solvent, and applying the solution to the electron auxiliary layer by a coating process, or by immersing the electron auxiliary layer in the solution.

In an embodiment, the manufacture of light emitting device, the light emitting layer, the hole auxiliary layer, and the electron auxiliary layer are formed by a solution process. Thus, the process of surface-treating the plurality of metal oxide nanoparticles with the base including the hydroxyl group may also be performed by a relatively simple method in which the electron auxiliary layer thin film is surface-treated with a base including a hydroxyl group in a solvent by a solution process to modify the surface characteristics of metal oxide nanoparticles in the electron auxiliary layer.

The method of coating the solution including the base to the electronic auxiliary layer may be a spin coating, a bar coating, a spray coating, a slit coating, an inkjet printing, a nozzle printing, spraying, or a doctor blade coating, but is not limited thereto.

The base including the hydroxyl group may have a molecular weight of greater than or equal to about 30 grams per mole (g/mol), for example greater than or equal to about 40 g/mol, greater than or equal to about 50 g/mol, greater than or equal to about 60 g/mol, greater than or equal to about 70 g/mol, greater than or equal to about 80 g/mol, greater than or equal to about 90 g/mol, or greater than or equal to about 100 g/mol, and less than or equal to about 600 g/mol, for example less than or equal to about 500 g/mol, less than or equal to about 400 g/mol, or less than or equal to about 300 g/mol, about 30 g/mol to about 600 g/mol, for example about 50 g/mol to about 500 g/mol, about 80 g/mol to about 400 g/mol, or about 100 g/mol to about 300 g/mol.

The base including the hydroxyl group may have $pK_b$ of less than or equal to about 10, for example less than or equal to about 9, less than or equal to about 8, or less than or equal to about 7, and greater than or equal to about 5, for example greater than or equal to about 6, greater than or equal to about 7, or greater than or equal to about 8, or in a $pK_b$ range of about 5 to about 10, for example about 6 to about 10, about 7 to about 10, or about 7 to about 9.

The base including the hydroxyl group may include an alkali metal hydroxide, an alkyl ammonium hydroxide, or a combination thereof, for example, the alkali metal hydroxide may include LiOH, NaOH, KOH, RbOH, CsOH, or a combination thereof, and the alkyl ammonium hydroxide may include tetramethylammonium hydroxide (TMAH), tetraethylammonium hydroxide (TEAH), tetra propylammonium hydroxide (TPAH), tetrabutylammonium hydroxide (TBAH), or a combination thereof.

The solvent may include water, acetone, alcohol, ether, ethyl acetate, dimethylsulfoxide (DMSO), or a combination thereof, which may be capable of dissolving the base including the hydroxyl group.

The concentration of the base including the hydroxyl group in the solution may be less than or equal to about 0.1 M, for example less than or equal to about 0.02 M, less than or equal to about 0.015 M, or less than or equal to about 0.010 M, and greater than or equal to about 0.001 M, for example greater than or equal to about 0.005 M, or greater than or equal to about 0.008 M, or in a concentration range of about 0.001 M to about 0.02 M, for example about 0.005 M to about 0.015 M, or about 0.008 M to about 0.010 M.

The forming of the electron auxiliary layer after contacting the plurality of metal oxide nanoparticles with a base including a hydroxyl group, may also include drying the electron auxiliary layer at room temperature, for example, at a temperature of greater than or equal to about 0° C., greater than or equal to about 10° C., greater than or equal to about 20° C., or greater than or equal to about and 100° C., and less than or equal to about 90° C., less than or equal to about 80° C., less than or equal to about 70° C., less than or equal to about 60° C., less than or equal to about 50° C., less than or equal to about 40° C., or less than or equal to about 30° C. so that the solvent from the electron auxiliary layer is removed. In addition, the drying may be performed under vacuum, for example, but is not limited thereto.

Another embodiment provides an electronic device including the aforementioned light emitting device.

The electronic device may be a display device (e.g., a QD-LED), a sensor (e.g., a biosensor, a bio-imaging sensor), a photodetector, a photoelectric conversion device, a laser, or a linear optical device.

Hereinafter, specific embodiments of the present disclosure are presented. However, the examples described below are for illustrative purposes only, and the scope of the present disclosure is not limited thereto.

Preparation Example: Preparation of Solution for Forming Electronic Auxiliary Layer Preparation Example 1: ZMO Synthesis 3.06 millimoles (mmol) of zinc acetate dihydrate, 0.54 mmol of magnesium acetate tetrahydrate, and 30 milliliters (mL) of dimethylsulfoxide are introduced into a reactor. 5.5 mmol of tetramethylammonium hydroxide pentahydrate (TMAH) is added to 10 mL of ethanol and the solution is introduced into the reactor. The reaction mixture is stirred at a room temperature (25° C.) for 1 hour. Following the reaction, the obtained $Zn_{0.85}Mg_{0.15}O$ nanoparticles are isolated, and a volume of ethyl acetate is added at a ratio of 1:4 (volume ratio). The mixture is centrifuged and the isolated nanoparticles are dispersed in ethanol to provide a solution for forming an electron auxiliary layer including the $Zn_{0.85}Mg_{0.15}O$ nanoparticles (average particle diameter: about 3 nanometers (nm).

Example: Manufacture of Light Emitting Device

Example 1

Following a surface-treatment with UV-ozone on the ITO-deposited glass substrate for 15 minutes, a PEDOT:PSS solution (H.C. Starks) is spin-coated on the substrate and heat-treated at 150° C. for 30 minutes to form a 30 nm-thick hole transport layer. A quantum dot light emitting layer, which emits light with a wavelength of 465 nm, is formed on the hole transport layer, and a heat-treatment is performed under a nitrogen atmosphere.

The ethanol dispersion of ZnMgO nanoparticles Preparation Example 1 is then used to form an electron transport layer. The ethanol dispersion is spin-coated on the quantum dot light emitting layer followed by a heat-treatment at 80° C. for 30 minutes.

A solution of tetramethylammonium hydroxide (TMAH) at a concentration of 10 mM in ethanol is prepared and spin-coated on the electron transport layer, and then dried under a nitrogen atmosphere at or near room temperature (10° C. to 30° C.) for 1 hour. A quantum dot light emitting device is manufactured by vacuum-depositing an aluminum electrode patterned in an electrode shape as an upper cathode material.

Example 2

A light emitting device is manufactured according to the same method as Example 1 except that the tetramethylammonium hydroxide (TMAH) is dissolved in an ethanol solvent at a concentration of 5 mM concentration.

Example 3

A light emitting device is manufactured according to the same method as Example 1 except that NaOH is used instead of the tetramethylammonium hydroxide (TMAH).

Example 4

A light emitting device is manufactured according to the same method as Example 1 except that CsOH is used instead of the tetramethylammonium hydroxide (TMAH).

Example 5

A light emitting device is manufactured according to the same method as Example 1 except that CsOH instead of the tetramethylammonium hydroxide (TMAH) is dissolved in an ethanol solvent at a concentration of 1 mM.

Comparative Example 1

A light emitting device is manufactured according to the same method as Example 1 except that the electron transport layer (ETL) is not surface-treated with the tetramethylammonium hydroxide (TMAH).

Comparative Example 2

A light emitting device is manufactured according to the same method as Example 1 except that the electron transport layer (ETL) is surface-treated with ethanol not including the tetramethylammonium hydroxide (TMAH).

Experimental Example 1: Evaluation of Characteristics of Light Emitting Devices Manufactured in Example 1 and Comparative Example 1

The light emitting devices according to Example 1 and Comparative Example 1 are evaluated with respect to electroluminescence properties by using a Keithley 2200 source measuring instrument and a Minolta CS2000 spectroradiometer (a current-voltage-luminance measuring instrument).

The light emitting devices are evaluated with respect to current verses applied voltage, luminance, and electroluminescence (EL) by using a current-voltage-luminance measuring instrument. The evaluation includes a calculation of external quantum efficiency, luminance, and luminescence life-span characteristics, and the results are shown in Table 1 and FIG. 4.

Figure 5:
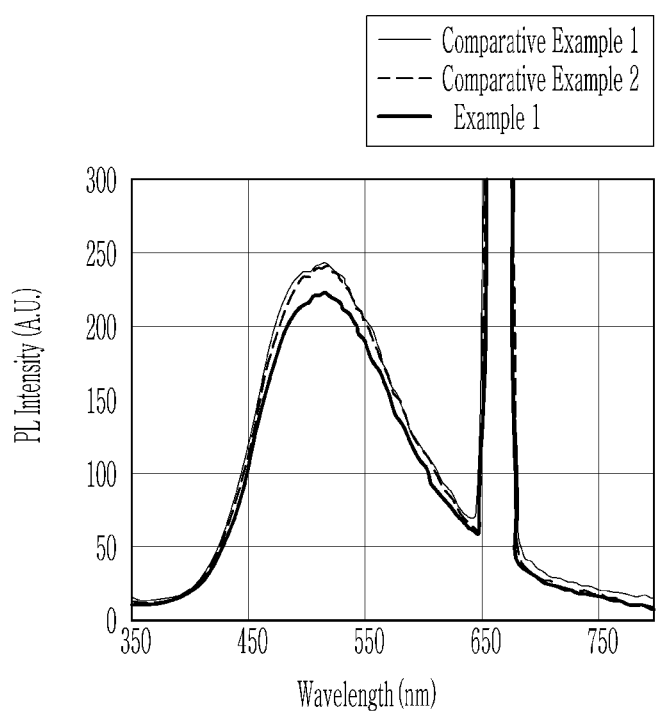
FIG. 5 is photoluminescence (PL) spectra of the light emitting devices of Example 1, Comparative Example 1, and Comparative Example 2.
Figure 6:
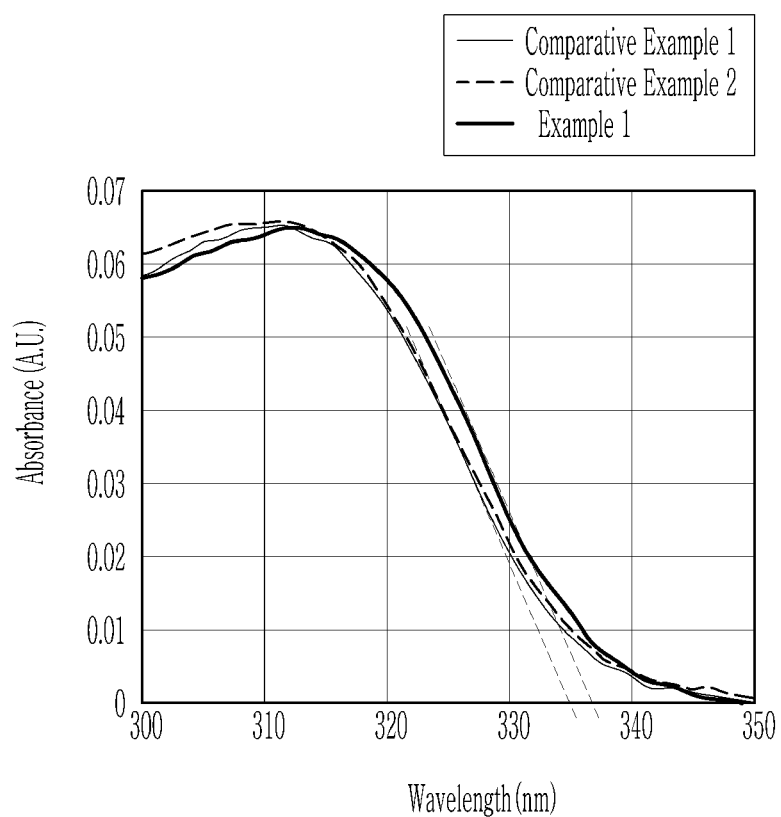
FIG. 6 is UV absorption spectra of the light emitting device of Example 1, Comparative Example 1, and Comparative Example 2.

In addition, with respect to the light emitting devices manufactured in Example 1, Comparative Example 1, and Comparative Example 2, photoluminescence (PL) spectra at an irradiation wavelength of 332 nm (slit: 5 nm) using a Hitachi F-7000 spectrometer are obtained, and UV absorption spectra are obtained using a Hitachi U-3310 spectrometer. The results are shown in FIGS. 5 and 6, respectively.

TABLE 1

|  | Example 1 | Comp. Example 1 |
|---|---|---|
| EQE max (%) [1] | 13.2 | 7.9 |
| Lum. max (Cd/m$^2$) [2] | 81920 | 63093 |
| EQE (@10000 nt) | 11.8 | 5.1 |
| Cd/A max | 13.5 | 10.2 |
| V (@5 mA) | 2.7 | 2.7 |

TABLE 1-continued

|  | Example 1 | Comp. Example 1 |
|---|---|---|
| V(@1000 nt) | 2.8 | 2.9 |
| T50 (hr) [3] | 94 | 51 |

[1] EQE max (%): maximum external quantum efficiency
[2] Lum. Max (Cd/m$^2$): maximum luminance
[3] T50(hr): time in hours taken for luminance to reach 50% based on initial luminance being 100%.

Figure 4:
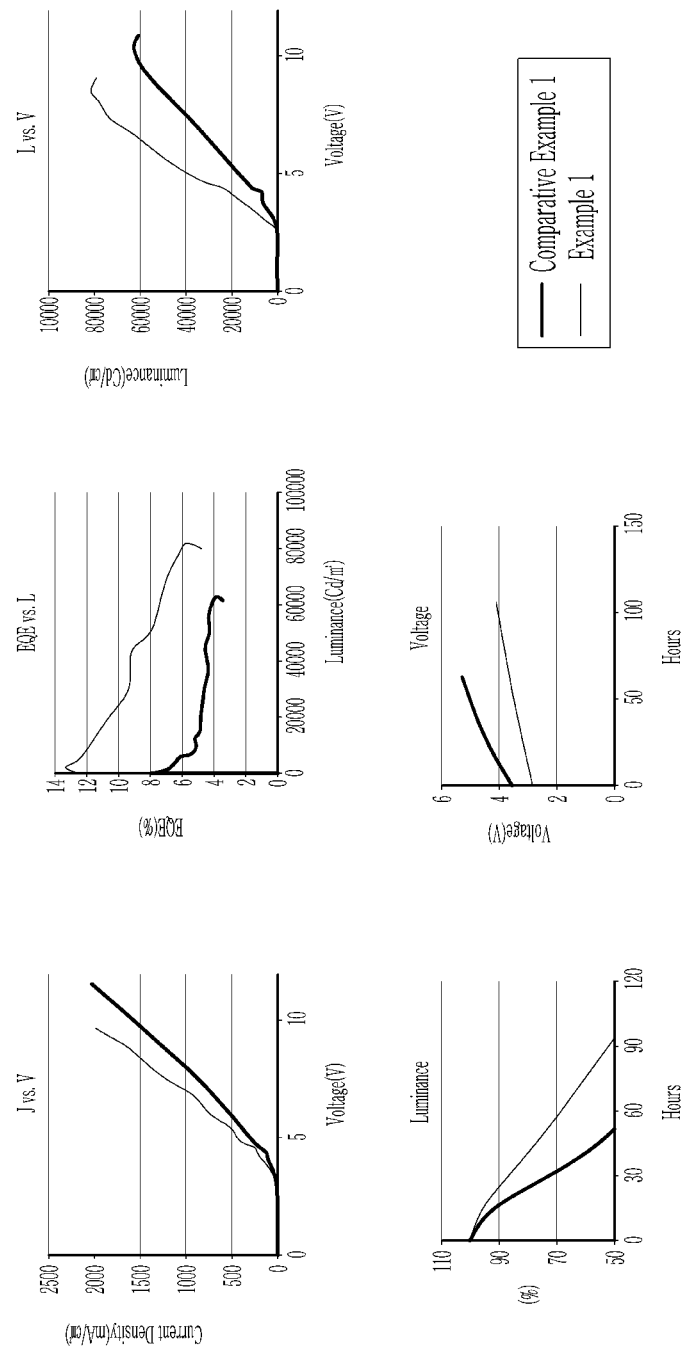
FIG. 4 are plots of current density vs. voltage, external quantum efficiency vs. luminance, luminance vs. voltage, luminance life-span, and life-span driving voltage of the light emitting devices of Example 1 and Comparative Example 1.

Referring to Table 1 and FIGS. 4, 5, and 6, the light emitting device according to Example 1 exhibits improved efficiency of about 8% to about 13%, improved luminance of about 63000 nit to about 82000 nit, and increased life-span (T50) of about 51 hr to about 94 hr, compared to the light emitting device according to Comparative Example 1.

Experimental Example 2: Evaluation of Characteristics of Light Emitting Devices Manufactured in Examples 3 and 4 and Comparative Example 1

Figure 7:
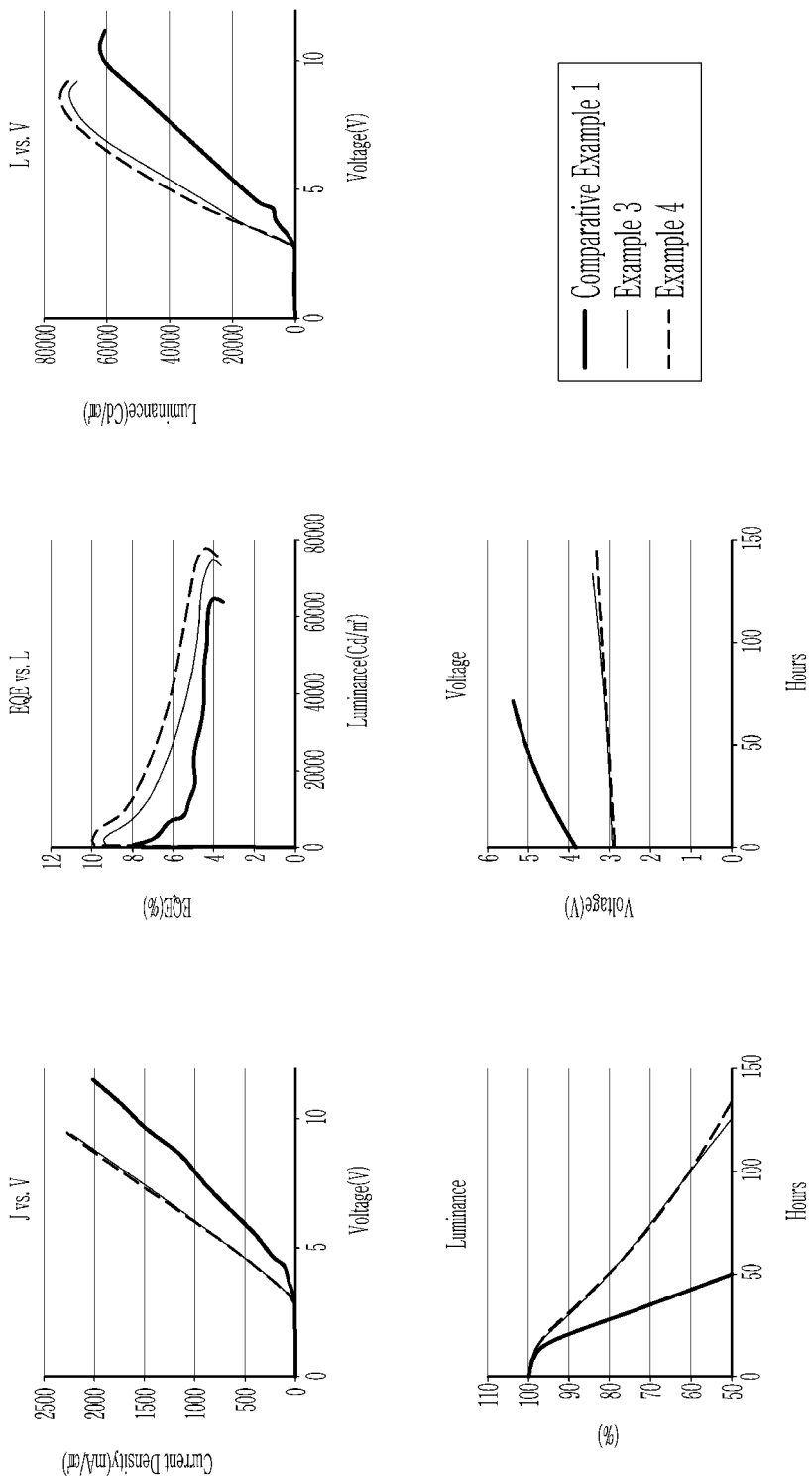
FIG. 7 are plots showing the measurement results of current density vs. voltage, external quantum efficiency vs. luminance, luminance vs. voltage, luminance life-span, and life-span driving voltage of the light emitting devices of Examples 3 and 4, and Comparative Example 1.

The light emitting devices according to Examples 3 and 4 and Comparative Example 1 are evaluated with respect to electroluminescence properties in accordance with the method of Experimental Example 1, and the results are shown in Table 2 and FIG. 7.

TABLE 2

|  | Example 3 | Example 4 | Comp. Example 1 |
|---|---|---|---|
| EQE max (%) | 9.2 | 9.7 | 7.9 |
| Lum. max (Cd/m$^2$) | 72832 | 75578 | 63093 |
| EQE (@10000 nt) | 7.4 | 8.1 | 5.1 |
| Cd/A max | 11.3 | 11.6 | 10.2 |
| V (@5 mA) | 2.6 | 2.6 | 2.7 |
| V (@1000 nt) | 2.7 | 2.7 | 2.9 |
| T50 (hr) | 122 | 130 | 51 |

Referring to FIG. 7 and Table 2, the light emitting devices according to Examples 3 and 4 exhibit improved efficiency from about 8% to about 10%, improved luminance from about 63000 nit to about 76000 nit, and increased life-span (T50) form about 51 hr to about 130 hr, compared with the light emitting device according to Comparative Example 1.

Experimental Example 3: IR Analysis Evaluation of Electron Auxiliary Layer

Figure 8:
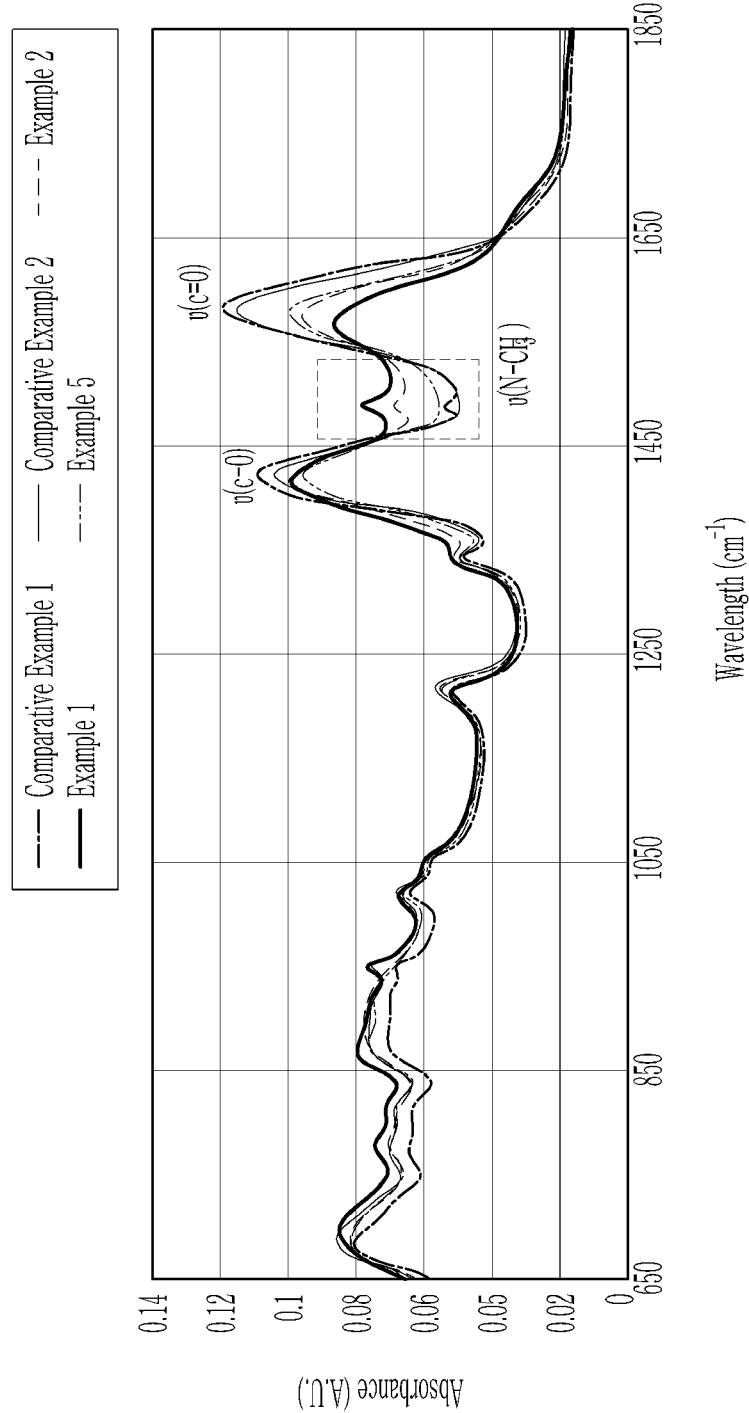
FIG. 8 are infrared spectra of the electron auxiliary layer of the light emitting devices of Examples 1, 2, and 5, and Comparative Examples 1 and 2.

The electron auxiliary layers of light emitting devices according to Examples 1, 2, and 5 and Comparative Examples 1 and 2 are evaluated by infrared spectroscopy, and the results are shown in FIG. 8 and Table 3.

The infrared spectroscopy analysis is performed using a FT-Varian 670-IR (Agilent, Harrick Seagull variable angle accessory) spectrometer and equipment, in an internal reflection (Hemisphere ATR) mode, in a range of 4000 cm$^{-1}$ to 650 cm$^{-1}$, 128 scans or more, Ge crystal, and an incident angle of 64 degrees.

TABLE 3

|  | Surface-treatment | v(C—O) | v(C=O) | v(N—CH$_3$) | $R_{C-O/C=O}$ | $R_{N-CH3/C=O}$ | $R_{N-CH3/C-O}$ |
|---|---|---|---|---|---|---|---|
| Comp. Example 1 | None | 0.107 | 0.118 | 0.053 | 0.91 | 0.449 | 0.495 |
| Comp. Example 2 | Ethanol | 0.102 | 0.114 | 0.049 | 0.90 | 0.430 | 0.480 |
| Example 2 | TMAH (5 mM) | 0.099 | 0.095 | 0.068 | 1.05 | 0.716 | 0.687 |

TABLE 3-continued

| | Surface-treatment | $v$(C—O) | $v$(C=O) | $v$(N—CH$_3$) | $R_{C-O/C=O}$ | $R_{N-CH3/C=O}$ | $R_{N-CH3/C-O}$ |
|---|---|---|---|---|---|---|---|
| Example 1 | TMAH (10 mM) | 0.099 | 0.086 | 0.076 | 1.15 | 0.884 | 0.768 |
| Example 5 | CsOH (1 mM) | 0.094 | 0.099 | 0.055 | 0.96 | 0.556 | 0.585 |

Referring to FIG. 8 and Table 3, the light emitting devices according to Examples 1, 2, and 5 exhibit improved efficiency, luminance, and life-span (T50) as the $R_{C-O/C=O}$ is greater than 0.91, compared with the light emitting devices according to Comparative Examples 1 and 2.

In addition, the light emitting devices according to Examples 1, 2, and 5, exhibit a value $R_{N-CH3/C=O}$ of greater than or equal to 0.45, and a value $R_{N-CH3/C-O}$ of greater than or equal to 0.50, resulting in improved efficiency, luminance, and life-span (T50), compared with the light emitting devices according to Comparative Examples 1 and 2.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

10: light emitting device
11: first electrode
12: hole auxiliary layer
13: light emitting layer
14: electron auxiliary layer
15: second electrode

What is claimed is:

1. A method of manufacturing a light emitting device, comprising
   providing a first electrode,
   forming a light emitting layer comprising quantum dots on the first electrode,
   forming an electron auxiliary layer on the light emitting layer, wherein the electron auxiliary layer comprises a plurality of metal oxide nanoparticles, and
   contacting the electron auxiliary layer, which includes the plurality of metal oxide nanoparticles, with a base comprising a hydroxyl group to provide a plurality of base-treated metal oxide nanoparticles, and
   forming a second electrode on the base contacted electron auxiliary layer,
   wherein the base comprising the hydroxyl group comprises cesium hydroxide, an alkylammonium hydroxide, or a combination thereof.

2. The method of claim 1, wherein the alkylammonium hydroxide comprises tetramethylammonium hydroxide, tetraethylammonium hydroxide, tetra propylammonium hydroxide, tetrabutylammonium hydroxide, or a combination thereof.

3. The method of claim 1, wherein the contacting of the electron auxiliary layer including the plurality of metal oxide nanoparticles with the base comprises
   preparing a solution by dissolving the base in a solvent, and
   applying the solution to the electron auxiliary layer to coat the electron auxiliary layer with the solution, or by immersing the electron auxiliary layer in the solution.

4. The method of claim 3, wherein the solvent comprises water, acetone, alcohol, ether, ethyl acetate, dimethylsulfoxide (DMSO), or a combination thereof.

5. The method of claim 3, wherein a concentration of the base in the solution is less than or equal to about 0.1 moles per liter.

6. The method of claim 1, wherein the base has a molecular weight of less than or equal to about 200 grams per mole, and a pKb of less than or equal to about 10.

7. The method of claim 1, further comprises drying the electron auxiliary layer, which includes the plurality of base-treated metal oxide nanoparticles, at about 0° C. to about 50° C.

* * * * *